United States Patent
Kuroda et al.

(10) Patent No.: US 8,680,941 B2
(45) Date of Patent: Mar. 25, 2014

(54) MICROWAVE HARMONIC PROCESSING CIRCUIT

(75) Inventors: Kenta Kuroda, Tokyo (JP); Kazuhiko Honjo, Tsukuba (JP)

(73) Assignee: The University of Electro-Communications, Chofu-shi (JP)

( * ) Notice: Subject to any disclaimer, the term of this patent is extended or adjusted under 35 U.S.C. 154(b) by 196 days.

(21) Appl. No.: 13/496,259

(22) PCT Filed: Sep. 7, 2010

(86) PCT No.: PCT/JP2010/065288
§ 371 (c)(1),
(2), (4) Date: Mar. 15, 2012

(87) PCT Pub. No.: WO2011/033962
PCT Pub. Date: Mar. 24, 2011

(65) Prior Publication Data
US 2012/0169431 A1   Jul. 5, 2012

(30) Foreign Application Priority Data
Sep. 18, 2009 (JP) .................................. 2009-217816

(51) Int. Cl.
*H03H 7/38* (2006.01)
(52) U.S. Cl.
USPC .......................................................... 333/33
(58) Field of Classification Search
USPC .......... 333/33, 34, 35, 263, 204; 330/286, 302
See application file for complete search history.

(56) References Cited

U.S. PATENT DOCUMENTS

| | | | |
|---|---|---|---|
| 8,558,637 B2 * | 10/2013 | Liu et al. | 333/33 |
| 2006/0103482 A1 * | 5/2006 | Hettak | 333/33 |

FOREIGN PATENT DOCUMENTS

| | | |
|---|---|---|
| JP | 07-094974 A | 4/1995 |
| JP | 2002-185211 A | 6/2002 |
| JP | 2008-113402 A | 5/2008 |
| JP | 4143805 B2 | 6/2008 |

OTHER PUBLICATIONS

Kuroda et al. Proceedings of the 38th European Microwave Conference, High-Efficiency GaN-HEMT Class-F Amplifier Operating at 5.7 GHz, pp. 440-443 (2008).

* cited by examiner

*Primary Examiner* — Stephen Jones
(74) *Attorney, Agent, or Firm* — Marvin A. Motsenbocker; Mots Law, PLLC

(57) ABSTRACT

A microwave harmonic processing circuit includes (n−1) parallel open ended stubs differing in length, connected in parallel to an output terminal of a serial transmission line at a single point, and having predetermined electrical lengths corresponding to second to higher n-th (n is any integer) harmonics, respectively, the serial transmission line having an input terminal connected to an output terminal of a transistor and having a predetermined electrical length; a first strip conductor connecting the serial transmission line to two parallel open ended stubs of the (n−1) parallel open ended stubs at a single connecting point; a second strip conductor connecting the (n−3) parallel open ended stubs to each other at a single connecting point; a ground layer disposed between first strip conductor and second strip conductor; and a via electrically connecting a connecting portion of first strip conductor and a connecting portion of second strip conductor.

9 Claims, 11 Drawing Sheets

(a)

(b)

(a)

(b)

(a)

(b)

US 8,680,941 B2

MICROWAVE HARMONIC PROCESSING CIRCUIT

TECHNICAL FIELD

The present invention relates to a microwave harmonic processing circuit used in a microwave band in particular.

BACKGROUND ART

Generally, as means for improving the power efficiency of an amplifier using a transistor such as a high-output HEMT (High Electron Mobility Transistor), a microwave harmonic processing circuit configured to reflect harmonics is connected to the output terminal of the transistor.

This microwave harmonic processing circuit is configured to control the waveforms of the current and voltage at the output terminal of the transistor by reflecting harmonics to the transistor. This is done by making the impedance at the transistor's output terminal short-circuited for even-order harmonics and open-circuited for odd-order harmonics. This operation is called class-F operation. The class-F operation eliminates overlaps between the instantaneous current and instantaneous voltage of the output of the transistor and thereby reduces the power consumption in the transistor. Accordingly, the power efficiency of the amplifier can be improved.

FIG. 1 shows a plan view of a conventional microwave harmonic processing circuit of Example 1. FIG. 2 shows an equivalent circuit capable of achieving microwave characteristics which is the design goal of the microwave harmonic processing circuit in FIG. 1. The microwave harmonic processing circuit shown in FIG. 1 is formed by using microstrip lines on a single flat plane; an input microwave main line T11, an output microwave main line T12, and four stubs T21 to T24 each having one end open circuited are connected to each other at a single connecting point 70. The equivalent circuit shown in FIG. 2 can be implemented by using the microstrip lines shown in FIG. 1.

In addition, as a conventional technique, there has been known a microwave harmonic processing circuit for a class-F, high-efficiency power amplifier which is shown in FIG. 3 (Patent Document 1). This microwave harmonic processing circuit includes a microwave main line T11, a microwave main line T12, multiple first stubs T2 to T7, and a synthesis compensation stub T*. The length of each of the microwave main lines T11 and T12 is equal to ¼ of a wavelength λ of the fundamental wave in the output of the transistor. A length L of each of the multiple first stubs T2 to T7 is equal to λ/4 m. The magnitude of the admittance of the synthesis compensation stub T* is equal to that of the synthetic input admittance of the multiple first stubs T2 to T7 but has the opposite sign.

According to this configuration, the microwave main line T11 brings the input impedance against the fundamental wave to zero; the multiple first stubs T2 to T7 bring the impedances in harmonics at a point A to zero; and the synthesis compensation stub T* removes influences of the multiple first stubs T2 to T7 on the fundamental wave.

In addition, as a conventional technique, there has been known a high-efficiency amplifier using a microwave harmonic processing circuit shown in FIG. 4 (Patent Document 2). This amplifier includes a harmonic reflection stub 20A which is connected to the output terminal of an amplification transistor 10A and in which input susceptances at multiple frequencies that are integer multiples of a fundamental frequency $f_o$ are diffused. The amplifier includes a fundamental wave matching circuit 30 which has one end connected to the output terminal of the amplification transistor 10A in parallel with the harmonic reflection stub 20A and the other end connected to a load circuit, and is capable of impedance matching of the sum of the output admittance of the amplification transistor 10A and the input susceptance of the harmonic reflection stub 20A to the impedance value of the load circuit.

The harmonic reflection stub 20A includes: one stem stub T21A having one end connected to the output terminal of the amplification transistor 10A; and multiple branch stubs T22A and T23A connected in parallel to the other end of the stem stub T21A in a branching manner. By this configuration, an amplifier with a small mounting area can achieve high efficiency, broad band characteristics.

In addition, as a convention technique, the present inventors have disclosed a class-F amplifier in a 5.8 GHz band in an article given in a European Microwave Conference (Non-Patent Document 1).

PRIOR ART DOCUMENTS

Patent Documents

Patent Document 1: Japanese Patent No. 4143805
Patent Document 2: Japanese Patent Application Publication No. 2008-113402

Non-Patent Document

Non-patent Document 1: Kuroda et al. Proceeding of the 38th European Microwave Conference, High-Efficiency GaN-HEMT Class-F Amplifier Operating at 5.7 GHz, pp 440-443 (2008)

SUMMARY OF THE INVENTION

Problems to be Solved by the Invention

In the microwave harmonic processing circuit shown in FIG. 1, however, the connecting point 70 is made large, and the angle between the adjacent ones of the stubs T21 to T24 is smaller than 90 degrees. Hence, magnetic fields generated by currents in the adjacent stubs are coupled to each other, changing their resonance frequencies. Moreover, since there are spots where the stubs are close to each other, electric coupling may increase the parasitic capacitance.

In class-F amplifier load circuits, multiple parallel open ended stubs need to be used to make the impedance, as seen from the transistor toward the load, short-circuited for even-order harmonics and open-circuited for odd-order harmonics. However, even the circuit of Patent Document 1 cannot avoid the interposition of a parasitic circuit element due to the above reason, and therefore the application is limited to circuits in which the fundamental wave has a frequency of around 2 GHz and the fifth harmonic has a frequency of around 10 GHz.

Moreover, in a state where the parallel open ended stubs in Patent Document 2 are mounted, layers in the multilayer structure are not electrically shielded from each other, and therefore electric coupling is present between substrates in many locations. In addition, since the line elements in the same substrate are not kept at right angles to each other, magnetic coupling is present. Accordingly, the circuit's operating frequency cannot be increased drastically.

At present, for class-F amplifiers in a 5.8 GHz band considered a potential band for various applications, it is necessary to accurately process frequencies of up to 40.6 GHz which is the seventh harmonic, but an ideal class-F amplifier has not yet been achieved due to the above reasons. Thus, as described in Non-Patent Document 1, class-F amplifiers in a 5.8 GHz band can only process the third harmonic at most, and the load power efficiencies of the amplifiers are around 68% and are significantly different from the required power efficiency in a microwave band, which is 85% or higher.

An object of the present invention is to provide a microwave harmonic processing circuit capable of improving the power efficiency to a large extent.

To solve the above problems, the present invention includes: a serial transmission line having an input terminal connected to an output terminal of a transistor and having a predetermined electrical length; (n−1) parallel open ended stubs differing in length, connected in parallel to an output terminal of the serial transmission line at a single point, and having predetermined electrical lengths corresponding to second to higher n-th (n is any integer) harmonics, respectively; a first transmission line layer configured by connecting the serial transmission line to two parallel open ended stubs of the (n−1) parallel open ended stubs at a single connecting point; a second transmission line layer configured by connecting the (n−3) parallel open ended stubs exclusive of the two parallel open ended stubs at a single connecting point; a ground layer disposed between the first transmission line layer and the second transmission line layer; and a via electrically connecting the connecting point in the first transmission line layer and the connecting point in the second transmission line layer.

Effects of the Invention

In the present invention, many parallel open ended stubs having mutually different lengths are electrically connected to each other at a single connecting point; circuit elements connected to the connecting point are separated to multiple layers of a first transmission line layer and a second transmission line layer; and a ground layer is interposed between the first transmission line layer and the second transmission line layer. Accordingly, the layers are electrically shielded from each other, preventing coupling between the first transmission line layer and the second transmission line layer.

Moreover, the connecting point in the first transmission line layer and the connecting point in the second transmission line layer are electrically connected to each other through a via. Accordingly, it is possible to suppress a parasitic component generated due to increase in the physical areas of the connecting portions, as well as magnetic coupling and electric coupling between the circuit elements caused due to close arrangement of the elements.

As a result, ideal multiple parallel open ended stubs can be connected, providing a remarkable effect in an ultra-high-efficiency, class-F power amplifier and the like in microwave bands.

MODES FOR CARRYING OUT THE INVENTION

Figure 1:
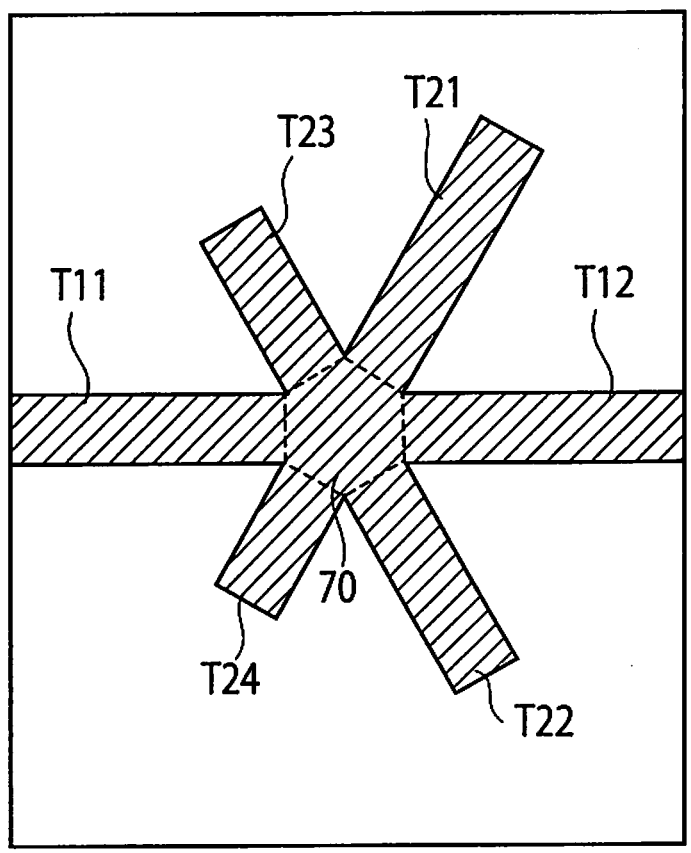
FIG. 1 is a plan view showing Example 1 of a conventional microwave harmonic processing circuit.
Figure 2:
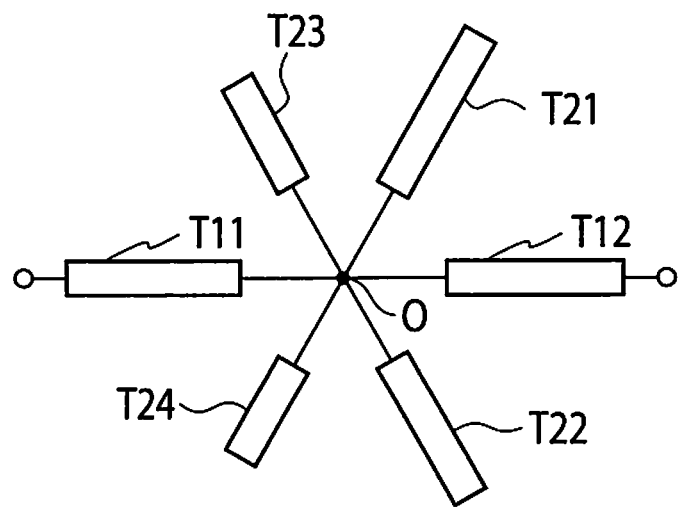
FIG. 2 is a diagram showing a target equivalent circuit of the microwave harmonic processing circuit in FIG. 1.
Figure 3:
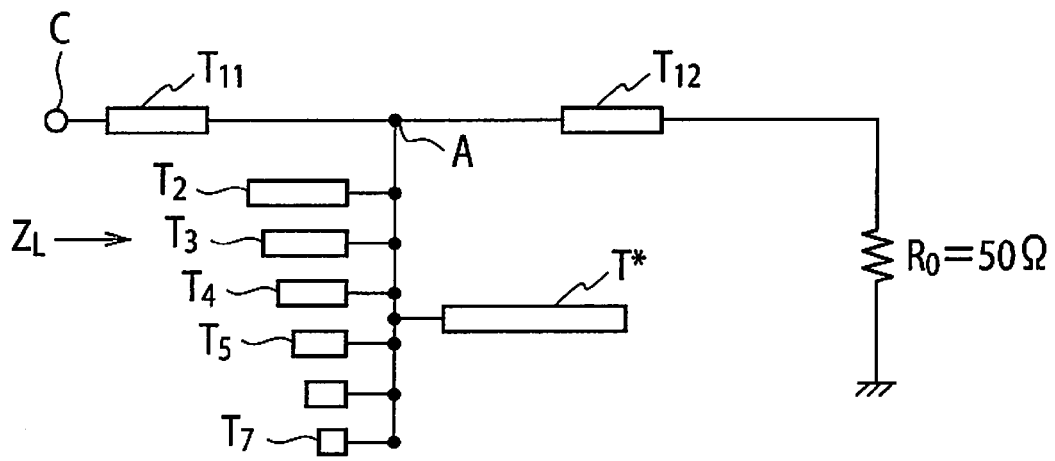
FIG. 3 is a circuit configuration diagram showing Example 2 of the conventional microwave harmonic processing circuit.
Figure 4:
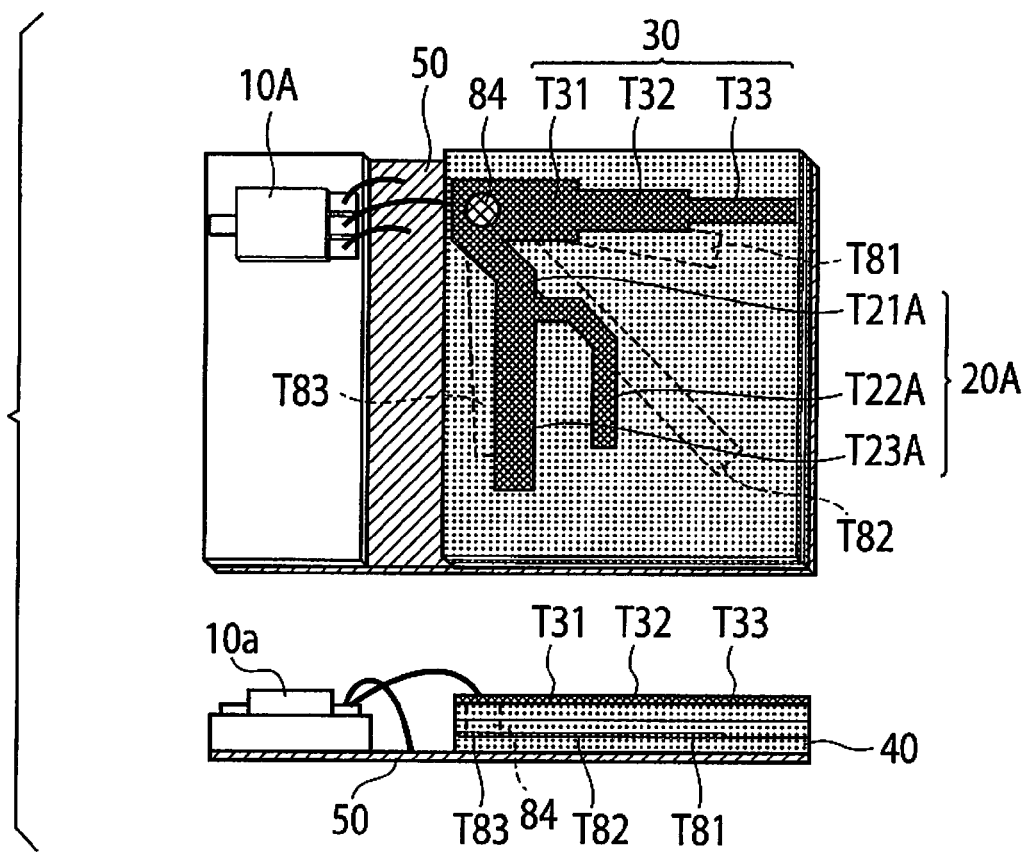
FIG. 4 is a plan view and a cross-sectional view showing Example 3 of the conventional microwave harmonic processing circuit.

Hereinbelow, embodiments of the microwave harmonic processing circuit of the present invention will be described in detail by referring to the drawings. The present invention is such that in a microwave planar circuit in which many parallel open ended stubs having mutually different lengths need to be electrically connected to each other at a single connecting point, circuit elements connected to the connecting point are separated to multiple planar circuits, and a multilayer strip line structure is formed in which the layers are electrically shielded from each other so as to prevent coupling between the planar circuits.

Moreover, the present invention is such that the lines are disposed in such a way that the angle between the lines in the same layer is 90 degrees to eliminate magnetic coupling, and further the connecting points separated to the multiple planar circuits are electrically connected through a via.

Embodiment 1

Figure 5:
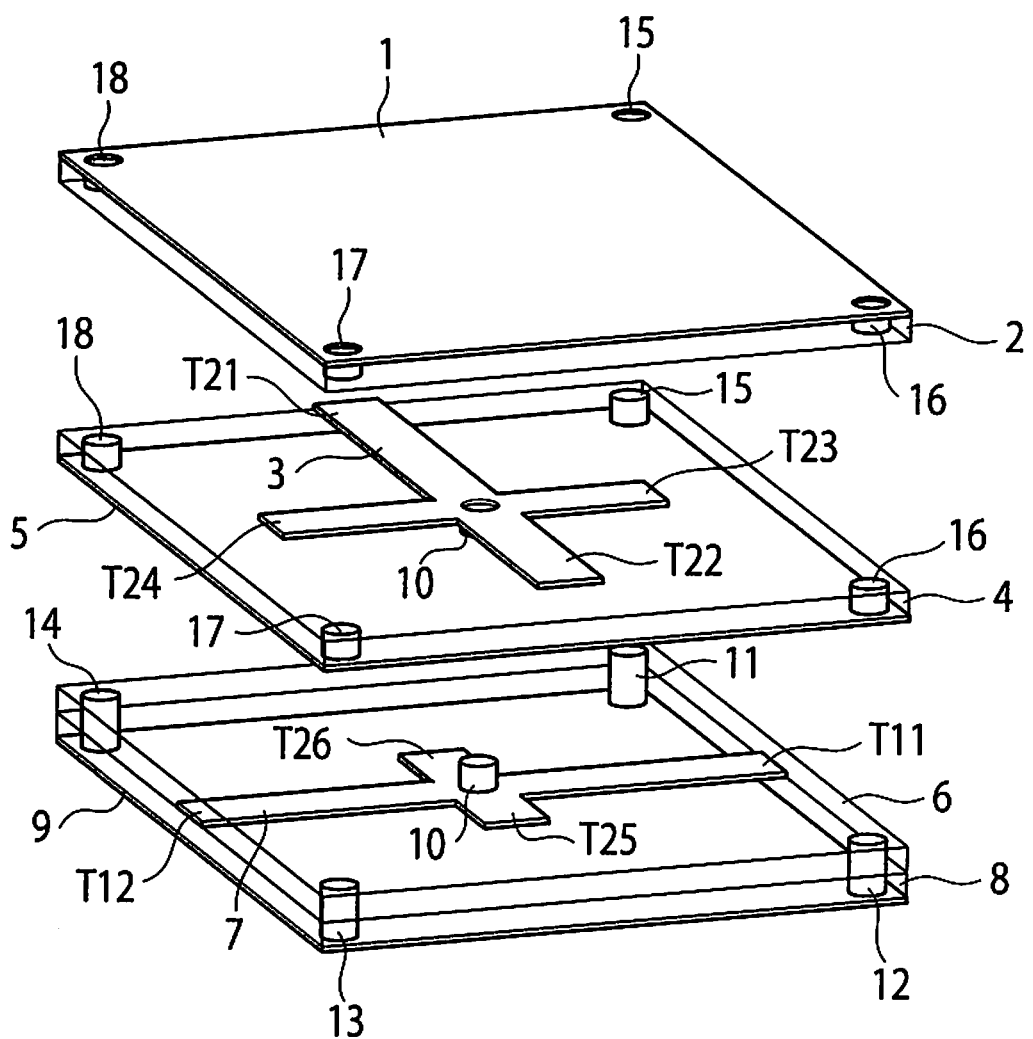
FIG. 5 is a bird's-eye view of the configuration of a microwave harmonic processing circuit of Embodiment 1 of the present invention.

FIG. 5 is a bird's-eye view of the configuration of a microwave harmonic processing circuit of Embodiment 1 of the present invention. As shown in the bird's-eye view of the configuration in FIG. 5 and the cross-sectional view in FIG. 9, a rectangular first ground layer 1 is disposed on a dielectric member 2, and a cross-shaped second strip conductor (second transmission line layer) 3 is disposed between the dielectric member 2 and a dielectric member 4.

A rectangular second ground layer 5 is disposed on the lower surface of the dielectric member 4, and a dielectric member 6 is disposed on the lower surface of the second ground layer 5. A cross-shaped first strip conductor (first transmission line layer) 7 is disposed between the dielectric member 6 and a dielectric member 8. A rectangular third ground layer 9 is disposed on the lower surface of the dielectric member 8.

The second strip conductor 3 and the first ground layer 1 disposed thereabove form a second strip line layer. The first strip conductor 7 and the third ground layer 9 disposed therebelow form a first strip line layer.

The first ground layer 1, the second ground layer 5, and the third ground layer 9 are each made of a conductor. The dielectric members 2, 4, 6, and 8 are each made of Teflon (registered trademark), glass epoxy resin, ceramic, or the like.

Figure 6:
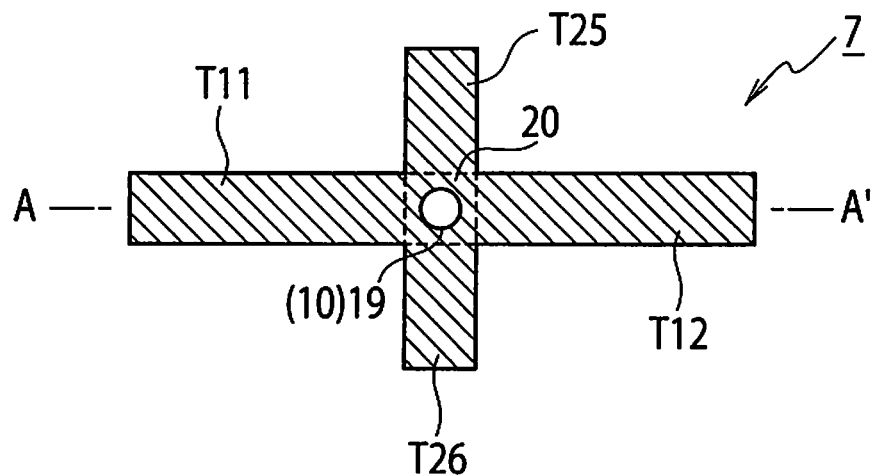
FIG. 6 is a diagram showing a first strip conductor in the microwave harmonic processing circuit of Embodiment 1 of the present invention.

As shown in FIG. 6, the first strip conductor 7 is constituted of a microwave main line T11, a microwave main line T12, and two parallel open ended stubs T25 and T26 which are perpendicular to the microwave main lines T11 and T12. The microwave main lines T11 and T12 and the two parallel open ended stubs T25 and T26 are connected to each other at a single connecting portion 20, and a metal via 10 is formed at the center of the connecting portion 20.

Figure 7:
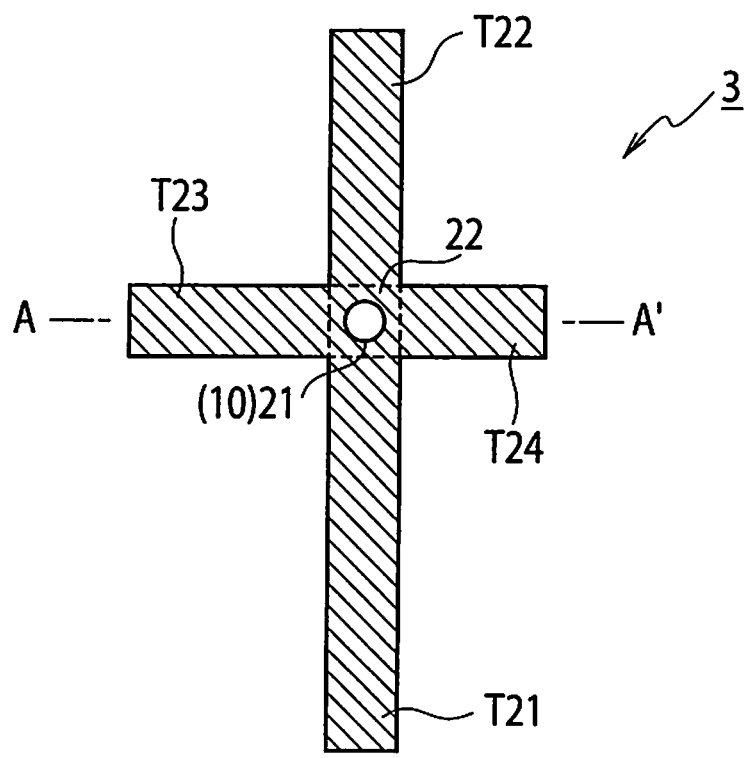
FIG. 7 is a diagram showing a second strip conductor in the microwave harmonic processing circuit of Embodiment 1 of the present invention.

As shown in FIG. 7, the second strip conductor 3 is constituted of four parallel open ended stubs T21, T22, T23, and T24 which are perpendicular to each other. The four parallel open ended stubs T21, T22, T23, and T24 are connected to each other at a single connecting portion 22, and a metal via 10 is formed at the center of the connecting portion 22.

The attachment position (connecting portion 20) of the parallel open ended stubs T25 and T26 to microwave main lines T11 and T22 constituting the first strip conductor 7 and the branch point (connecting portion 22) of the four parallel open ended stubs T21 to T24 constituting the second strip conductor 3 vertically coincide with each other and are electrically connected to each other by the vias 10 by the most direct way.

Figure 8:
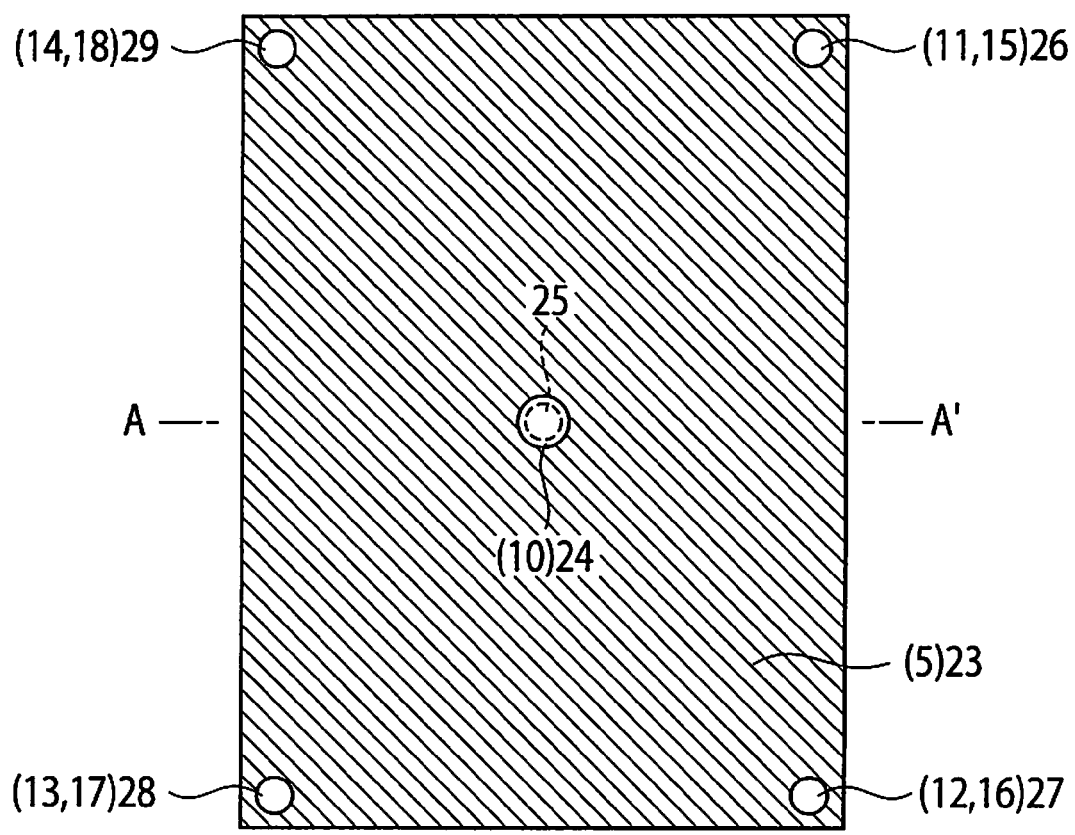
FIG. 8 is a diagram showing a second ground layer in the microwave harmonic processing circuit of Embodiment 1 of the present invention.

Moreover, as shown in FIG. 8, a hole 24 with a larger diameter than the diameters of the vias 10 are provided in the second ground layer 5 so as to avoid electric contact between the first and second strip conductors 3 and 7 and the second ground layer 5 through the vias 10. Moreover, the three ground layers 1, 5, and 9 are connected to each other by vias 11 to 16 provided at the four corners of the ground layers 1, 5, and 9 and are electrically integrated with each other as a ground layer.

Figure 10:
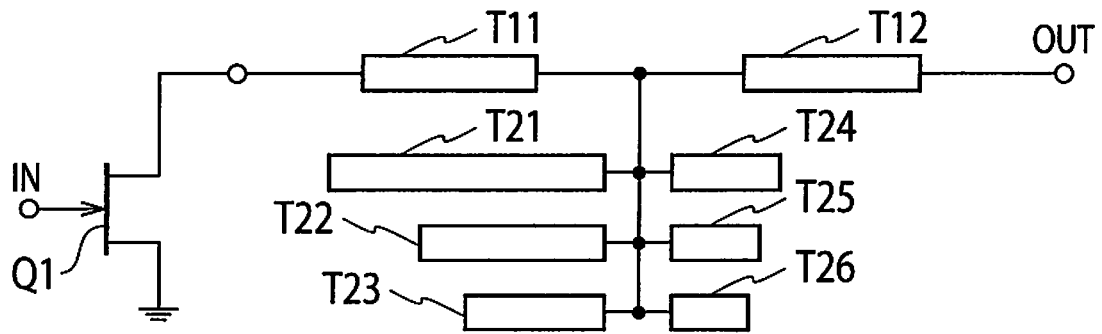
FIG. 10 is a diagram showing a target equivalent circuit of the microwave harmonic processing circuit of Embodiment 1 of the present invention.

FIG. 10 shows a target equivalent circuit of the microwave harmonic processing circuit of Embodiment 1 of the present invention. The microwave harmonic processing circuit shown in FIG. 10 includes the microwave main line (serial transmission line) T11 having its input terminal connected to the output terminal of a high-output transistor Q1 such as a HEMT and having an electrical length of a quarter wavelength of the fundamental wave; the microwave main line T12 (whose electrical length may not be limited to the quarter wavelength) connected to a matching section to an unillustrated load; and (n−1=6) parallel open ended stubs T21 to T26 differing in length, connected in parallel to the output terminal of the microwave main line T11 at a single point and having quarter wavelengths of the second to higher n-th harmonics, respectively (n is any integer) (n is 7 in Embodiment 1).

Specifically, the parallel open ended stub T21 has an electrical length of a quarter wavelength of the second harmonic; the parallel open ended stub T22 has an electrical length of a quarter wavelength of the third harmonic; the parallel open ended stub T23 has an electrical length of a quarter wavelength of the fourth harmonic; the parallel open ended stub T24 has an electrical length of a quarter wavelength of the fifth harmonic; the parallel open ended stub T25 has an electrical length of a quarter wavelength of the sixth harmonic; and the parallel open ended stub T26 has an electrical length of a quarter wavelength of the seventh harmonic. Note that the parallel open ended stubs T21 to T26 only need to have electrical lengths of equivalent quarter wavelengths.

Figure 11:
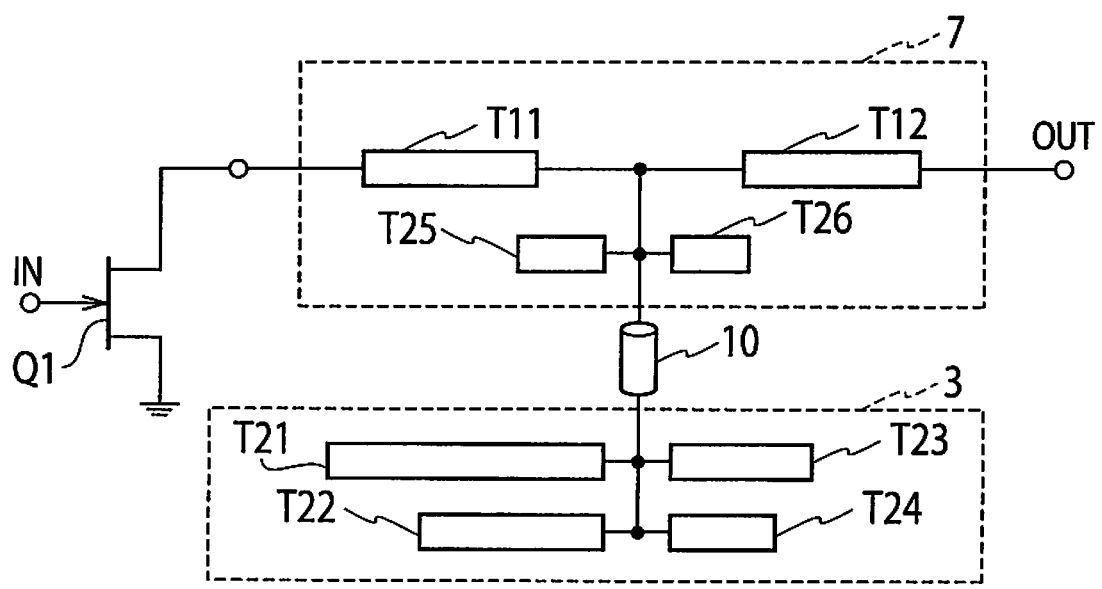
FIG. 11 is a diagram showing an equivalent circuit reflecting a multilayer structure with the first strip conductor and the second strip conductor in the microwave harmonic processing circuit of Embodiment 1 of the present invention.

FIG. 11 shows an equivalent circuit reflecting a multilayer structure with the first strip conductor 7 and the second strip conductor 3 in the microwave harmonic processing circuit of Embodiment 1 of the present invention. The configuration shown in FIG. 11 corresponds to the configuration shown in FIGS. 5 and 9.

In FIG. 11, of the six parallel open ended stubs T21 to T26, the shortest parallel open ended stub T26 configured to process the highest-order harmonic is provided on the first strip conductor 7 having the microwave main line T11 and is connected to the output terminal of the microwave main line T11 by the most direct way. The longest parallel open ended stub T21 configured to process the lowest-order harmonic is provided on the second strip conductor 3 and is connected to the output terminal of the microwave main line T11 through the vias 10.

As described, in the microwave harmonic processing circuit of Embodiment 1, the many parallel open ended stubs T21 to T26 having mutually different lengths are electrically connected to each other at a single connecting point; the circuit elements connected to the connecting point are separated to multiple layers of the first strip conductor 7 and the second strip conductor 3; and the second ground layer 5 is interposed between the first strip conductor 7 and the second strip conductor 3. Accordingly, the first strip conductor 7 and the second strip conductor 3 are electrically shielded from each other completely, preventing coupling between the first strip conductor 7 and the second strip conductor 3.

Moreover, the connecting portion 20 of the first strip conductor 7 and the connecting portion 22 of the second strip conductor 3 are electrically connected to each other through the vias 10. Accordingly, it is possible to suppress a parasitic component generated due to increase in the physical areas of the connecting portions 20 and 22, as well as magnetic coupling and electric coupling between the circuit elements caused due to close arrangement of the circuit elements.

As a result, ideal multiple parallel open ended stubs can be connected, providing a remarkable effect in an ultra-high-efficiency, class-F power amplifier and the like in microwave bands and millimeter-wave bands.

In addition, the microwave main line T11, microwave main line T12, parallel open ended stub T25, and parallel open ended stub T26 of the first strip conductor 7 are disposed at 90 degrees to each other, and the four parallel open ended stubs T21, T22, T23, and T24 of the second strip conductor 3 are disposed at 90 degrees to each other. Accordingly, magnetic coupling can be prevented.

In addition, since the stubs for processing the harmonics have short lengths, the highest-order parallel open ended stub T26 is provided to the first strip conductor 7, and the lowest-order parallel open ended stub T21 is provided to the second strip conductor 3. Accordingly, influences of the phase errors in the harmonics can be significantly reduced when they are mounted.

Meanwhile, conventional microwave harmonic processing circuits have been only capable of processing signals of up to the third harmonic in an environment where the frequency is 5.8 GHz.

As compared to this, the microwave harmonic processing circuit of Embodiment 1 is such that n is set to 7, providing the six parallel open ended stubs T21 to T26 having mutually different length, and the impedance as seen from the transistor's output terminal to the load side is short-circuited for even-order harmonics and open-circuited for odd-order harmonics to thereby process signals of up to the seventh harmonic. Thus, the power efficiency can be raised closer to the ideal efficiency, which is 100%. In other words, the power efficiency can be improved significantly.

In recent years, 5.8 GHz band in particular has been drawing attention for microwave power transmission and the like, and in this 5.8 GHz band, the seventh harmonic has a frequency of 40.6 GHz. Thus, designing a class-F amplifier in this band requires highly accurate circuit designing involving microwave to millimeter wave. In this respect, the present invention brings about a great advantage. By using the microwave harmonic processing circuit of the present invention for a microwave transistor such as a GaN HEMT, it is possible to achieve a power efficiency of 85% or higher even in a 5.8 GHz band.

Embodiment 2

Figure 12:
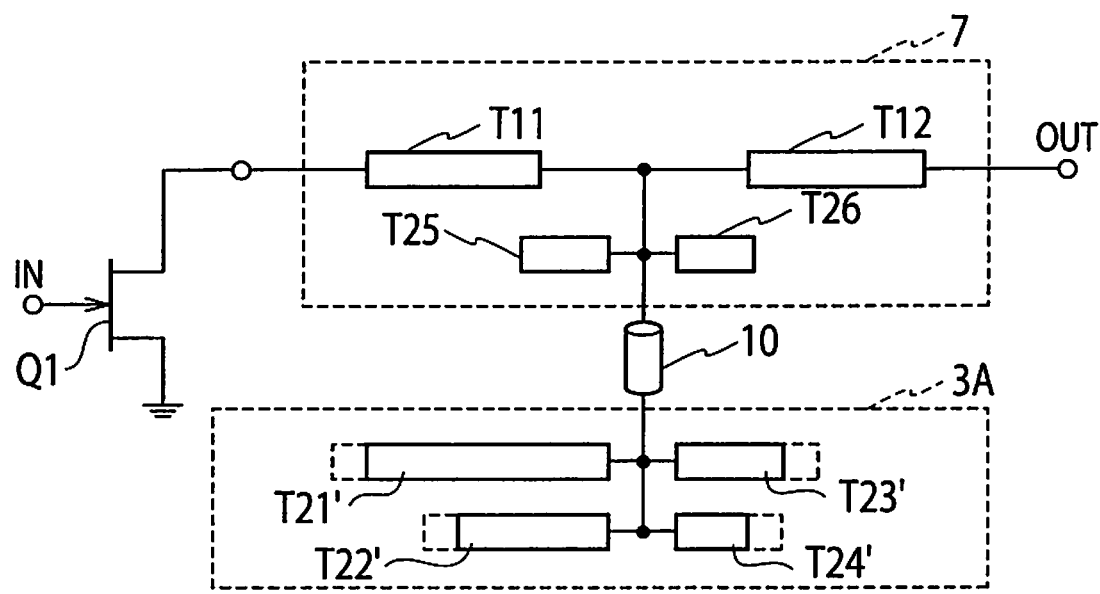
FIG. 12 is a diagram showing an equivalent circuit of a microwave harmonic processing circuit of Embodiment 2 of the present invention.

FIG. 12 is a diagram showing an equivalent circuit of a microwave harmonic processing circuit of Embodiment 2 of the present invention. In the microwave harmonic processing circuit of Embodiment 2 shown in FIG. 12, the stub length of each of parallel open ended stubs T21', T22', T23', and T24' disposed in a second strip conductor 3A is set shorter in consideration of the electrical length of the vias 10.

That is, the parallel open ended stubs T21', T22', T23', and T24' are set to have stub lengths corrected based on the electrical length of the vias 10. Accordingly, many stubs can be electrically connected to each other at a single point more accurately.

Embodiment 3

Figure 13:
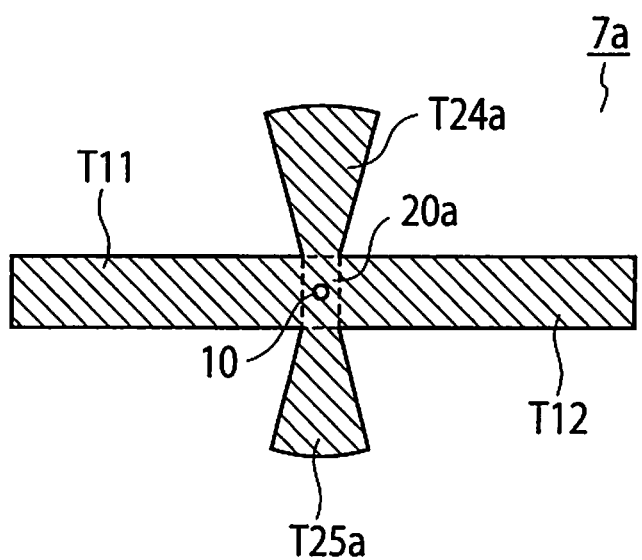
FIG. 13 is a diagram showing a first strip conductor in a microwave harmonic processing circuit of Embodiment 3 of the present invention.

FIG. 13 is a diagram showing a first strip conductor in a microwave harmonic processing circuit of Embodiment 3 of the present invention. In a first strip conductor 7a of Embodiment 3 shown in FIG. 13, the microwave main lines T11 and T12 and parallel open ended stubs T24a and 25a are connected to each other at a connecting portion 20a, the parallel open ended stubs T24a and 25a being formed as fan-shaped stubs each increasing in width as extending from the connecting portion 20a in a fan shape. Moreover, a metal via 10 is formed at the center of the connecting portion 20a.

Figure 14:
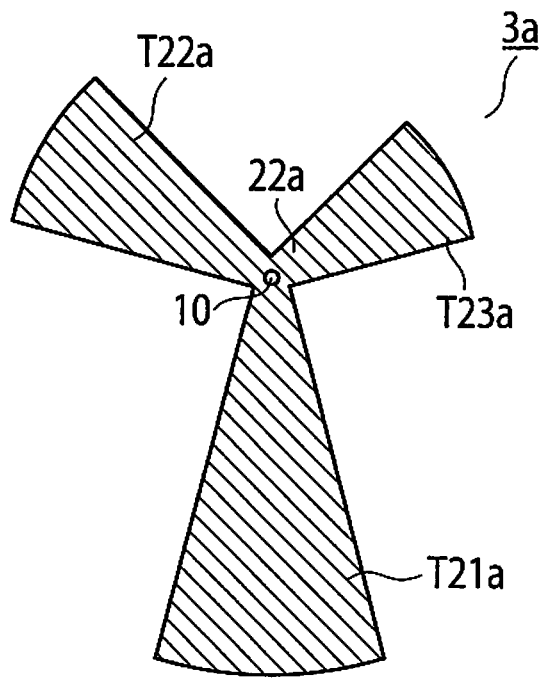
FIG. 14 is a diagram showing a second strip conductor in the microwave harmonic processing circuit of Embodiment 3 of the present invention.

As shown in FIG. 14, a second strip conductor 3a is constituted of three parallel open ended stubs T21a, T22a, and 23a formed as fan-shaped stubs each increasing in width as extending from the connecting portion 22a in a fan shape. The three parallel open ended stubs T21a, T22a, and T23a are connected to each other at a single connecting portion 22a, and a metal via 10 is formed at the center of the connecting portion 22a.

The three parallel open ended stubs T21a, T22a, and T23a are disposed at 90 degrees to each other. Accordingly, magnetic coupling can be prevented.

The attachment position (connecting portion 20a) of the parallel open ended stubs T25a and T26a to microwave main lines T11 and T12 constituting the first strip conductor 7a and the branch point (connecting portion 22a) of the three parallel open ended stubs T21a to T24a constituting the second strip conductor 3a vertically coincide with each other and are electrically connected to each other by the vias 10 by the most direct way.

Figure 15:
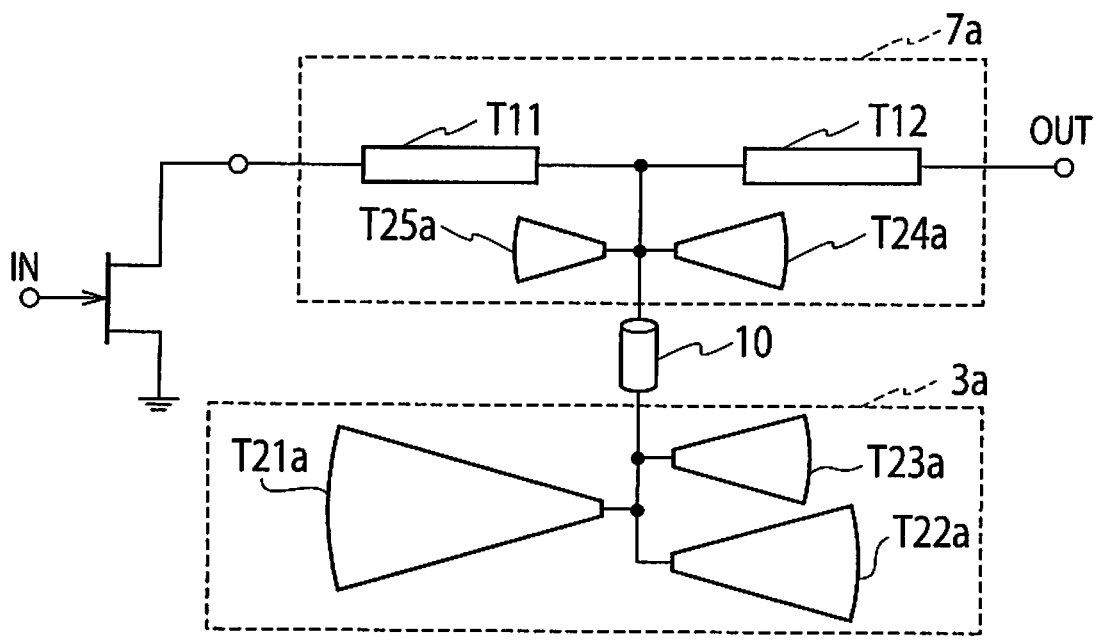
FIG. 15 is a diagram showing an equivalent circuit reflecting a multilayer structure with the first strip conductor and the second strip conductor in the microwave harmonic processing circuit of Embodiment 3 of the present invention.

FIG. 15 shows an equivalent circuit reflecting a multilayer structure with the first strip conductor 7a and the second strip conductor 3a in the microwave harmonic processing circuit of Embodiment 3 of the present invention.

As described, with the microwave harmonic processing circuit of Embodiment 3, the advantageous effect of the microwave harmonic processing circuit of Embodiment 1 can be achieved. Furthermore, since the parallel open ended stubs T21a to T25a are each shaped as such a bow-tie stub (fan-shaped stub) as to increase in stub width as extending from the attachment position (connecting portion 20a, 22a) of the stub, the electrical uncertainty of the attachment position of the stub can be reduced.

Meanwhile, the number of stubs is set to three for the parallel open ended stubs T21a to T23a formed in a different layer from that of the microwave main lines T11 and T12 so as to maintain a right angle between the edges of the stubs where electric current is concentrated.

Embodiment 4

Figure 9:
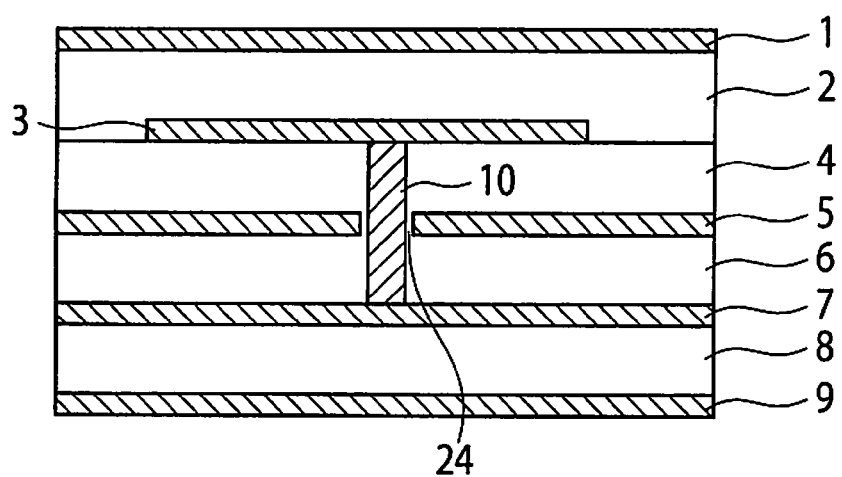
FIG. 9 is a cross-sectional view of the microwave harmonic processing circuit of Embodiment 1 of the present invention, taken along the A-A' line.
Figure 16:
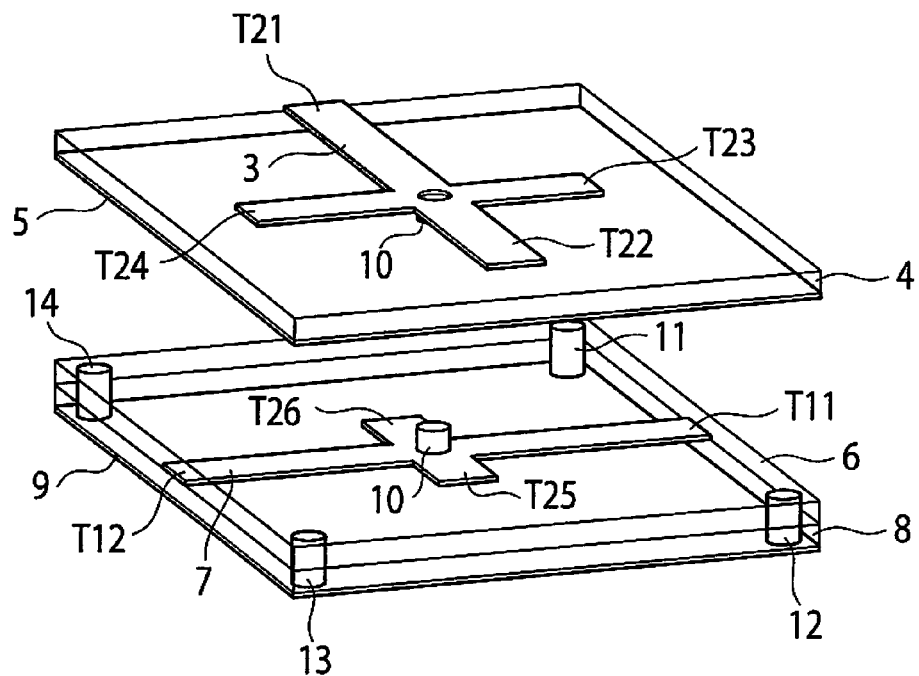
FIG. 16 Part (a) of FIG. 16 is a bird's-eye view of the configuration of a microwave harmonic processing circuit of Embodiment 4 of the present invention, and Part (b) of FIG. 16 is a cross-sectional view of the microwave harmonic processing circuit.
Figure 16:
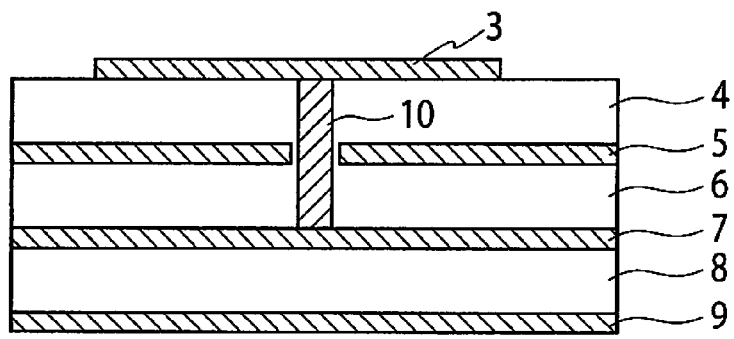

Part (a) of FIG. 16 is a bird's-eye view of the configuration of a microwave harmonic processing circuit of Embodiment 4 of the present invention, and Part (b) of FIG. 16 is a cross-sectional view of the microwave harmonic processing circuit. The microwave harmonic processing circuit of Embodiment 4 shown in FIG. 16 is characterized in that the first ground layer 1 and the dielectric member 2 in the microwave harmonic processing circuit of Embodiment 1 shown in FIG. 9 are removed and only the uppermost second strip conductor 3 is set as an open circuited microstrip line.

The uppermost second strip conductor 3 has the second ground layer 5 therebelow, and thus there is no electric or magnetic coupling thereof to the parallel open ended stubs T25 and T26 formed as strip lines on the microwave main lines T11 and T12. Accordingly, the cost of the microwave harmonic processing circuit can be reduced.

Embodiment 5

Figure 17:
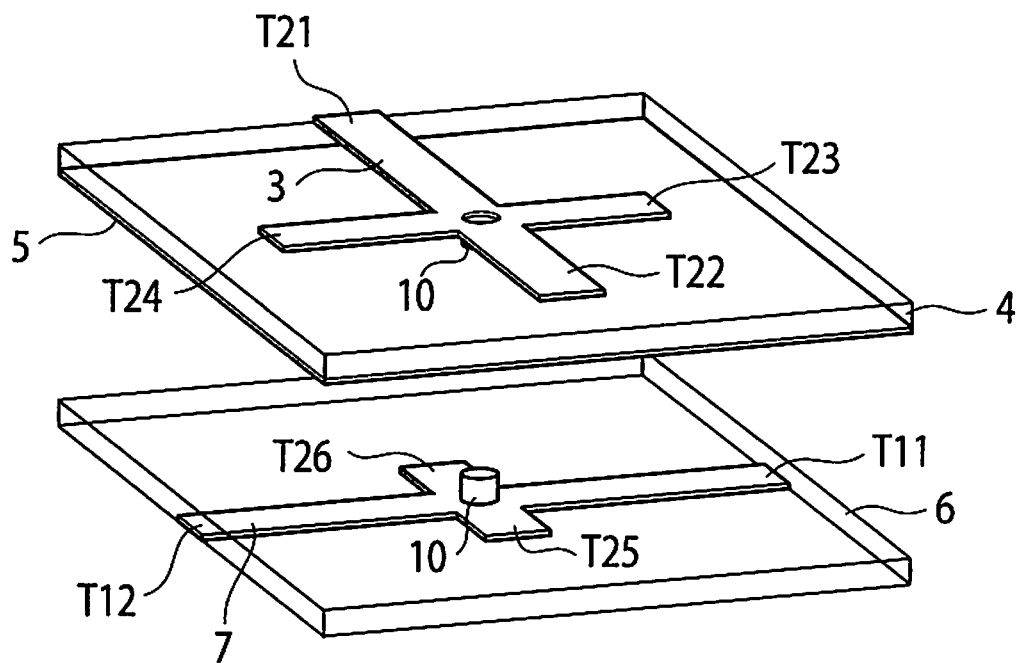
FIG. 17 Part (a) of FIG. 17 is a bird's-eye view of the configuration of a microwave harmonic processing circuit of Embodiment 5 of the present invention, and Part (b) of FIG. 17 is a cross-sectional view of the microwave harmonic processing circuit.
Figure 17:
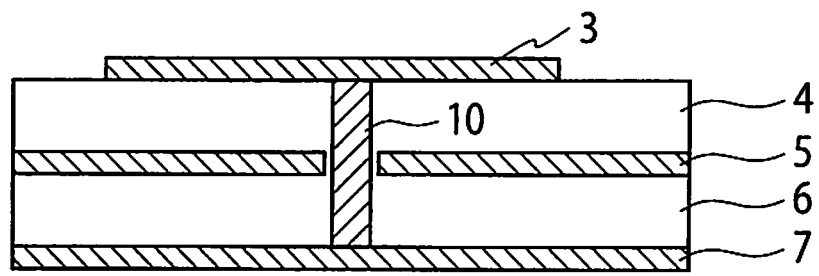

Part (a) of FIG. 17 is a bird's-eye view of a configuration of a microwave harmonic processing circuit of Embodiment 5 of the present invention, and Part (b) of FIG. 17 is a cross-sectional view of the microwave harmonic processing circuit. The microwave harmonic processing circuit of Embodiment 5 shown in FIG. 17 is characterized in that a third ground layer 9 and the dielectric member 8 in the microwave harmonic processing circuit of Embodiment 4 shown in FIG. 16 are removed and the first strip conductor 7 and the uppermost second strip conductor 3 constitute a microstrip line.

The uppermost second strip conductor 3 has the second ground layer therebelow, and thus there is no electric or magnetic coupling thereof to the parallel open ended stubs T25 and T26 formed as strip lines on the microwave main lines T11 and T12. Accordingly, the cost of the microwave harmonic processing circuit can be reduced.

Note that the prevent invention is not limited to the microwave harmonic processing circuits of Embodiment 1 to Embodiment 4 described above. The present invention can be applied similarly to harmonic processing in which n is 8 or greater, although n=7 and signals of the fundamental wave to the seventh harmonic are processed in the microwave harmonic processing circuits of Embodiments 1, 3, and 4, and n=6 and signals of the fundamental wave to the sixth harmonic are processed in the microwave harmonic processing circuit of Embodiment 2.

For example, when n is 8 or greater, a third strip conductor (third transmission line layer) may further be disposed on top of the first ground layer 1 shown in FIG. 9 with a dielectric member interposed therebetween, and a fourth strip conductor (fourth transmission line layer) may further be disposed on top of the third strip conductor with a dielectric member and a ground layer interposed therebetween.

In this case, of (n−3) parallel open ended stubs, the second strip conductor 3 is configured by connecting four parallel open ended stubs to each other at a single connecting point. Of the remaining (n−7) parallel open ended stubs, maximum four parallel open stubs are disposed in each of the third strip conductor and the fourth strip conductor.

The parallel open ended stubs disposed in the third strip conductor and the parallel open ended stubs disposed in the fourth strip conductor are connected to each other at their respective single connecting points and connected through their respective vias to the via 10 of the second strip conductor 3.

Moreover, in each of the third strip conductor and the third strip conductor, the adjacent parallel open ended stubs are disposed at 90 degrees to each other, thereby preventing magnetic coupling. As described above, the present invention can be applied to a case where n is 8 or greater.

Note that in each of Embodiments described above, the electrical length of the microwave main line (serial transmission line) T11 is described as ¼λ, of the fundamental wave. In the actual design, however, a parasitic capacitance and a parasitic inductance exist in the output of the transistor Q1 serving as a switching element. For this reason, it is possible that the electrical length of the microwave main line T11 is designed shorter than ¼λ of the fundamental wave in view of the amounts of these parasitic components. Thus, the electrical length of the microwave main line T11 is designed to be equivalently, i.e., substantially equal to ¼λ of the fundamental wave.

An allowable shortened length Δλ for this equivalent electrical length ¼λ is determined as a length expressed in a formula given below. For example, it is possible that the electrical length of the microwave main line T11 is shortened by approximately −20% of λ/4, depending upon the amounts of the parasitic components.

When a parasitic capacitance $C_p$ and a parasitic inductance $L_p$ exist in the output of the transistor Q1 as shown in Part (a) of FIG. 18, the shortened length by which the microwave main line T11 is made shorter than λ/4 for compensation can be found through approximation to a transmission line as described below.

Figure 18:
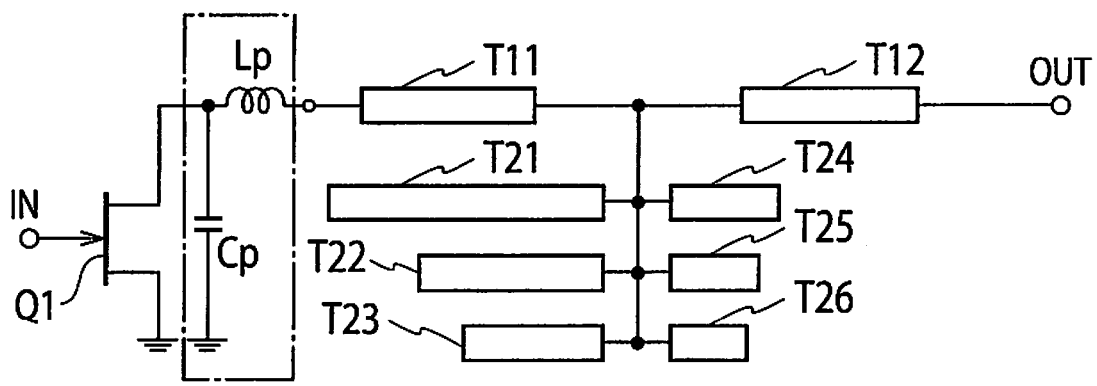
FIG. 18 is a diagram for explaining a case where the electrical length of a microwave main line T11 is designed shorter than $\frac{1}{4}\lambda$ of the fundamental wave in view of the amounts of parasitic components due to a parasitic capacitance and a parasitic inductance present in the output of a transistor.
Figure 18:
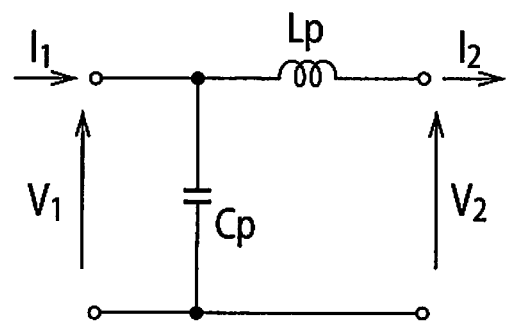

As shown in Part (b) of FIG. 18, finding an F matrix of only the area inside the chain line in Part (a) of FIG. 18 is expressed as follows.

[Formula 1]

$$\begin{pmatrix} V_1 \\ I_1 \end{pmatrix} = \begin{pmatrix} 1 & jwL_P \\ jwC_P & 1 - w^2 L_P C_P \end{pmatrix} \begin{pmatrix} V_2 \\ I_2 \end{pmatrix} \quad (1)$$

Next, the following relationship between the F matrix and image parameters is used to find a transfer constant 0 of this circuit.

[Formula 2]

$$F = \begin{pmatrix} A & B \\ C & D \end{pmatrix} = \begin{pmatrix} \sqrt{\frac{Z_{01}}{Z_{02}}} \cosh\theta & \sqrt{Z_{01}Z_{02}} \sinh\theta \\ \frac{1}{\sqrt{Z_{01}Z_{02}}} \sinh\theta & \sqrt{\frac{Z_{02}}{Z_{01}}} \cosh\theta \end{pmatrix} \quad (2)$$

By substituting the formula (2) into the formula (1) and rearranging the result, we obtain cosh θ as below.

[Formula 3]

$$\cosh\theta = \sqrt{1 - w^2 L_p C_p} \quad (3)$$

If a cutoff frequency $$f_c = \frac{1}{2\pi\sqrt{L_P C_P}}$$

is sufficiently higher than the frequency of the highest-order harmonic to be processed, the right side of the above formula is a real number. Then, if θ=α+jβ (when the highest-order frequency is higher than the cutoff frequency, it is impossible to obtain a load circuit which can perform processing up to that order),

[Formula 4]

$$\alpha = 0, \cos\beta = \sqrt{1 - w^2 L_p C_p} \quad (4)$$

is obtained.

If the parasitic components surrounded by the broken line in Part (a) of FIG. 18 are considered as a transmission line, then the electrical length thereof is $$\beta = \arccos\sqrt{1 - w_0^2 L_p C_p} (rad)$$

by substituting $w_0 = 2\pi f_0$ (where $f_0$ is the frequency of the fundamental wave). Thus, the length of the microwave main line T11 should be

[Formula 5]

$$\left( \frac{1}{4} - \frac{\arccos\sqrt{1 - w_0^2 L_P C_P}}{2\pi} \right) \lambda \quad (5)$$

with respect to the fundamental wave.

Although the above has shown a simple case where the parasitic components are only $C_p$ and $L_p$, the length can be found similarly for more complicated cases as well.

Moreover, although the above has described the case where the three ground layers 1, 5, and 9 shown in FIG. 8 are connected by the vias 11 to 16 provided at the four corners of the ground layers 1, 5, and 9, the number of the vias is not limited to four and can be increased or decreased as long as a electrically grounded state is achieved.

INDUSTRIAL APPLICABILITY

The microwave harmonic processing circuit of the present invention can be applied to microwave class-F amplifiers.

| EXPLANATION OF REFERENCE NUMERALS | |
| --- | --- |
| 1 | first ground layer |
| 2, 4, 6, 8 | dielectric member |
| 3 | second strip conductor |
| 5 | second ground layer |
| 7 | first strip conductor |
| 9 | third ground layer |
| 10 to 16 | via |
| 20, 22 | connecting portion |
| T11, T12 | microwave main line |
| T21 to T26 | parallel open ended stub |
| Q1 | switching element |

The invention claimed is:

1. A microwave harmonic processing circuit comprising:
a serial transmission line having an input terminal connected to an output terminal of a transistor and having a predetermined electrical length;
(n−1) parallel open ended stubs differing in length, connected in parallel to an output terminal of the serial transmission line at a single point, and having predetermined electrical lengths corresponding to second to higher n-th (n is any integer) harmonics, respectively;
a first transmission line layer configured by connecting the serial transmission line to two parallel open ended stubs of the (n−1) parallel open ended stubs at a single connecting point;
a second transmission line layer configured by connecting the (n−3) parallel open ended stubs exclusive of the two parallel open ended stubs at a single connecting point;
a ground layer disposed between the first transmission line layer and the second transmission line layer; and
a via electrically connecting the connecting point in the first transmission line layer and the connecting point in the second transmission line layer.

2. The microwave harmonic processing circuit according to claim 1, wherein the serial transmission line is a serial transmission line having an electrical length of an equivalently quarter wavelength of a fundamental wave.

3. The microwave harmonic processing circuit according to claim 1, wherein
the second transmission line layer includes four or fewer parallel open ended stubs, and
an angle between adjacent ones of the parallel open ended stubs is 90 degrees.

4. The microwave harmonic processing circuit according to claim 1, wherein a highest-order parallel open ended stub is provided to the first transmission line layer, whereas a lowest-order parallel open ended stub is provided to the second transmission line layer.

5. The microwave harmonic processing circuit according to claim 1, wherein the parallel open ended stubs are formed as fan-shaped stubs each increasing in width as extending from the connecting portion in a fan shape.

6. The microwave harmonic processing circuit according to claim 1, wherein the second transmission line layer and an upper ground layer disposed thereabove form a second strip line layer.

7. The microwave harmonic processing circuit according to claim 1, wherein the first transmission line layer and a lower ground layer disposed therebelow form a first strip line layer.

8. The microwave harmonic processing circuit according to claim 1, wherein the parallel open ended stubs disposed in the second transmission line layer have stub lengths corrected based on a small electrical length the via has.

9. The microwave harmonic processing circuit according to claim 1, further comprising:
a third transmission line layer; and
a fourth transmission line layer, wherein
the second transmission line layer configured by connecting four parallel open ended stubs of the (n−3) parallel open ended stubs at the single connecting point, and
of a remaining (n−7) parallel open ended stubs, maximum four parallel open ended stubs are disposed in each of the third transmission line layer and the fourth transmission line layer.

* * * * *